United States Patent
Haselden et al.

(10) Patent No.: US 6,846,730 B2
(45) Date of Patent: Jan. 25, 2005

(54) TWO STAGE ETCHING OF SILICON NITRIDE TO FORM A NITRIDE SPACER

(75) Inventors: Barbara A. Haselden, Cupertino, CA (US); John Lee, Cupertino, CA (US)

(73) Assignee: ProMOS Technologies Inc., Hsin Chu (TW)

( * ) Notice: Subject to any disclaimer, the term of this patent is extended or adjusted under 35 U.S.C. 154(b) by 0 days.

(21) Appl. No.: 10/800,190

(22) Filed: Mar. 12, 2004

(65) Prior Publication Data

US 2004/0175955 A1 Sep. 9, 2004

Related U.S. Application Data

(62) Division of application No. 10/198,825, filed on Jul. 18, 2002.

(51) Int. Cl.$^7$ .......................................... H01L 21/3205
(52) U.S. Cl. ........................................ 438/538; 438/585
(58) Field of Search ................................. 438/538, 585

(56) References Cited

U.S. PATENT DOCUMENTS

| 5,643,824 | A | 7/1997 | Chien et al. |
| 5,786,276 | A | 7/1998 | Brooks et al. |
| 6,015,760 | A | 1/2000 | Becker et al. |
| 6,218,309 | B1 | 4/2001 | Miller et al. |
| 6,232,218 | B1 | 5/2001 | Cathey et al. |
| 6,277,700 | B1 | 8/2001 | Yu et al. |
| 6,281,132 | B1 | 8/2001 | Nguyen et al. |
| 6,355,524 | B1 | 3/2002 | Tuan et al. |

OTHER PUBLICATIONS http://www.lamrc.com/inside/products/9400dfm,html., Silicon Etch DFM, TCP® 9400DFM Poly Etch System, Mar. 22, 2002, 1 page.

*Primary Examiner*—Michael Tokar
*Assistant Examiner*—Lisa Kilday
(74) *Attorney, Agent, or Firm*—MacPherson Kwok Chen & Heid LLP; David S. Park

(57) ABSTRACT

A method of etching nitride over oxide is provided for the formation of vertical profile nitride spacers with high uniformity while maintaining the integrity of underlying thin oxide layers. The method includes providing a first gas flow including a first fluorocarbon and a second fluorocarbon at a first ratio, applying a first quantity of power to the first gas flow to create a first plasma, etching a first portion of a silicon nitride layer with the first plasma, providing a second gas flow including the first fluorocarbon and the second fluorocarbon at a second ratio greater than the first ratio, applying a second quantity of power to the second gas flow to create a second plasma, and etching a second portion of the silicon nitride layer with the second plasma.

11 Claims, 3 Drawing Sheets

TWO STAGE ETCHING OF SILICON NITRIDE TO FORM A NITRIDE SPACER

REFERENCE TO RELATED APPLICATIONS

This is a divisional application of U.S. patent application Ser. No. 10/198,825, entitled "Two Stage Etching Of Silicon Nitride To Form A Nitride Spacer", filed Jul. 18, 2002.

BACKGROUND

1. Field of the Invention

This invention generally relates to semiconductor processing and, more particularly, to a method of etching silicon nitride disposed over silicon oxide to form nitride spacers.

2. Description of Related Art

During the manufacture of miniaturized devices, intermediate and/or final structures are often formed with combinations of patterned materials composed of oxides and nitrides of silicon disposed adjacent to one another. The oxides and nitrides may be further disposed adjacent to monocrystalline, polycrystalline, or other forms of silicon. It is often times desirable to strip away or otherwise etch the silicon nitride ("nitride") material while not significantly etching into adjacent silicon or silicon oxide ("oxide").

For example, transistors are generally manufactured by placing an undoped polycrystalline silicon ("polysilicon") material over a semiconductor substrate. The polysilicon material is generally separated from the semiconductor substrate by an insulating layer, usually a relatively thin layer of oxide, such as silicon dioxide. The polysilicon material and the oxide are then patterned to form a gate arranged upon a gate oxide with source/drain regions adjacent to and on opposite sides of the gate. The gate and source/drain regions are then implanted with a dopant species. A channel region forms between the source/drain regions. The insulating layer is provided to prevent current from flowing between the gate and the source/drain regions or the channel region.

When scaling to smaller device geometries or operating transistors which have heavily doped source/drain regions arranged directly adjacent to the gate, a problem known as the hot carrier effect is encountered. Large potential gradients and/or shorter channel lengths, with resultant higher electric fields, cause the kinetic energy of the charged carriers to increase and thereby produce "hot" or energetic electrons. These electrons can become injected into and trapped within the gate oxide. Because of carrier entrapment within the gate oxide, a net negative charge density forms in the gate oxide. The trapped charge can accumulate over time, ultimately leading to device performance degradation or even, in some instances, device failure. The hot carrier effect is therefore a function of gate oxide thickness and overlap between the gate and the source/drain regions.

To overcome problems resulting from the hot carrier effect, alternative source/drain structures may be used. Alternative source/drain structures are often times formed by depositing and etching silicon nitride to create nitride spacers adjacent to the gate. The spacers will mask and align dopant and implant regions within the semiconductor substrate. Nitride is often chosen because it is a fairly stable material and is nearly impervious to diffusion, making it an excellent barrier material. Because of the effect that the length of doped regions has on circuit attributes (e.g., drive current), it is important that the thickness of these doped regions be as close to the desired values as possible. Consequently, it is desirable that there be a high degree of thickness uniformity in the formation of the spacers, which directly affect the formation of the doped regions. Accordingly, the thickness of etched spacers should vary as little as possible from desired values, with vertical profiles being preferred over sloped profiles. Spacer thickness uniformity should occur both across each spacer and from spacer to spacer.

A high degree of etch anisotropy is also desirable to produce vertical sidewalls for the nitride spacers, thereby conforming to the required critical dimension for submicron geometries from the top to the bottom of the nitride spacer. A low degree of etch anisotropy will produce undesirable sloping sidewalls, causing deviations from the required critical dimension.

Further, nitride spacers are often times formed from a nitride layer disposed over a liner oxide layer which is disposed over the gate and used as an etch stop and insulator. Because nitride etching often takes place in the presence of oxide, the etching must be selective so as to not overly remove any exposed oxide or oxide underneath the nitride layer, possibly resulting in oxide "punchthrough," while also not leaving any nitride residue between adjacent spacer structures, possibly resulting in nitride "stringers" that can cause device degradation. Selectivity is defined by the ratio of component etch rates. Thus, nitride to oxide selectivity is defined by:

$$\text{Selectivity}_{Nitride/Oxide} = \frac{\text{Etch rate of Nitride}(\text{Å}/\min)}{\text{Etch rate of Oxide}(\text{Å}/\min)}$$

Accordingly, a high selectivity for etching of nitride over oxide is important for accurately controlling the etch end point and for preventing damage to the gate or silicon substrate from overetching of the liner oxide layer, which itself is becoming increasingly thin with decreasing device features.

Therefore, with circuit densities increasing, a need exists for an improved method to form nitride spacers over a thin oxide layer with good uniformity, profile, and selectivity characteristics.

SUMMARY

In accordance with one embodiment of the present invention, a method of etching silicon nitride to form spacers is provided. The method includes providing a gate structure over a substrate, providing a silicon oxide layer over the gate structure and the substrate, providing a silicon nitride layer over the silicon oxide layer, providing a first gas flow having a first ratio of fluorine atoms to carbon atoms, applying a first quantity of power to the first gas flow to form a first plasma and etching a first portion of the silicon nitride layer with the first plasma, providing a second gas flow having a second ratio of fluorine atoms to carbon atoms greater than the first ratio of the first gas, and applying a second quantity of power to the second gas flow to form a second plasma and etching a second portion of the silicon nitride with the second plasma.

In another embodiment of the present invention, a manufacturing method includes providing a gate structure over a substrate, providing a silicon oxide layer over the gate structure and the substrate, providing a silicon nitride layer over the silicon oxide layer, providing a first gas flow including a first fluorocarbon and a second fluorocarbon at a first ratio, the first fluorocarbon having a higher ratio of fluorine atoms to carbon atoms than the second fluorocarbon, applying a first quantity of power to the first gas flow to create a first plasma and etching a first portion of the silicon nitride layer with the first plasma, providing a second gas flow including the first fluorocarbon and the second fluorocarbon at a second ratio greater than the first ratio of the first gas flow, and applying a second quantity of power to the second gas flow to create a second plasma and etching a second portion of the silicon nitride layer with the second plasma.

In yet another embodiment, a method of etching silicon nitride to form spacers includes providing a gate structure over a substrate, providing a silicon oxide layer over the gate structure and the substrate, providing a silicon nitride layer over the silicon oxide layer, providing a first gas flow including a first ratio of $CF_4$ flow rate to $CH_2F_2$ flow rate, applying a first quantity of power to the first gas flow to create a first plasma and etching a first portion of the silicon nitride layer with the first plasma at a first process pressure, providing a second gas flow including a second ratio of $CF_4$ flow rate to $CH_2F_2$ flow rate greater than the first ratio of $CF_4$ flow rate to $CH_2F_2$ flow rate, applying a second quantity of power to the second gas flow to create a second plasma, the second quantity of power being greater than the first quantity of power, and etching a second portion of the silicon nitride layer with the second plasma at a second process pressure greater than the first process pressure.

Advantageously, the present invention allows for nitride spacers to be formed with selectivity and profile characteristics not achievable with typical etch techniques when etching nitride over a thin oxide layer. The present invention clears nitride residue to form independent spacers which are substantially vertical and highly uniform while maintaining the underlying thin oxide layer.

These and other features and advantages of the present invention will be more readily apparent from the detailed description of the embodiments set forth below taken in conjunction with the accompanying drawings.

BRIEF DESCRIPTION OF THE DRAWINGS

The use of similar reference numerals in different figures indicates similar or identical items.

DETAILED DESCRIPTION

In accordance with an embodiment of the present invention, FIGS. 1–5 illustrate a method for etching a nitride layer disposed over a thin oxide layer using simultaneous ion bombardment and polymerizing chemistry. Such a method allows nitride spacers to be formed in the presence of oxide with uniformity, profile, and selectivity characteristics not possible with conventional methods.

Figure 1:
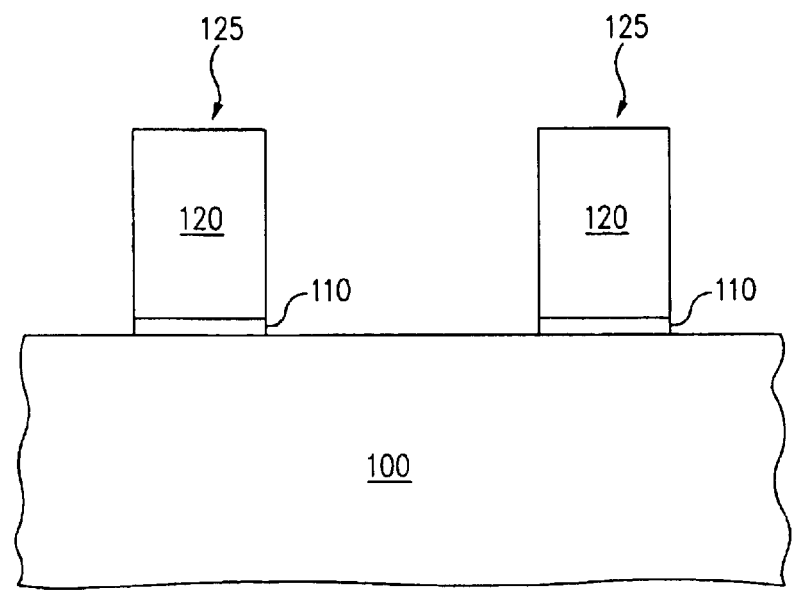
FIG. 1 is a cross-sectional view of two gate structures formed over a semiconductor substrate.

FIG. 1 depicts a semiconductor substrate 100. In one embodiment, substrate 100 is a wafer of single crystal silicon. A pair of gate structures 125 is formed over the surface of semiconductor substrate 100. In one embodiment, a gate structure 125 comprises a gate oxide 110 and a conductive gate 120. Gate oxide 110 may have a thickness greater than about 20 Å, and conductive gate 120 may have a width between about 0.14 µm and about 0.18 µm, and a height between about 4100 Å and about 5200 Å. A gate dielectric 110 may be comprised of different layers of material (e.g., oxide-nitride-oxide layers) or a single layer of material. Conductive gate 120 may also be comprised of different layers of material or a single layer of material, and is preferably comprised of polysilicon. Optionally, a lightly doped drain ("LDD") implant may be carried out after the formation of gate structures 125 to form LDD regions (not shown) within substrate 100 that are substantially aligned to gate structures 125.

Figure 2:
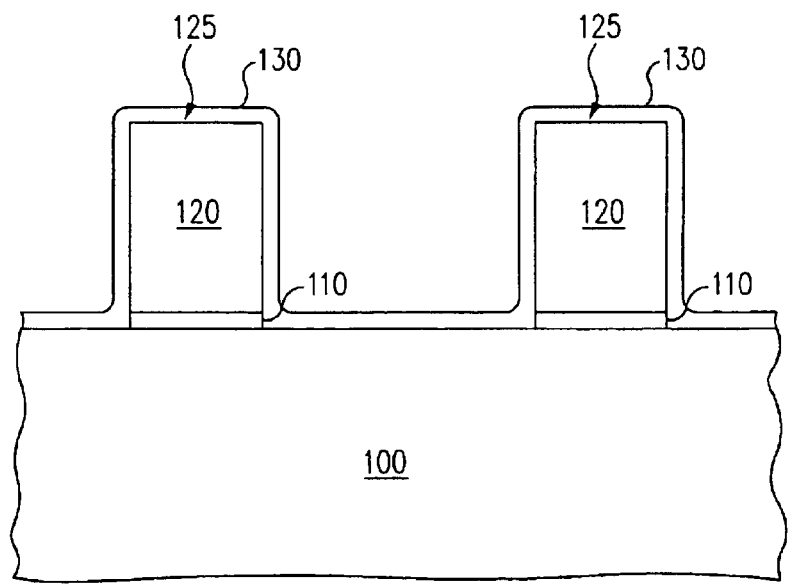
FIG. 2 is a cross-sectional view of an oxide layer disposed over the gate structures and semiconductor substrate of FIG. 1.
Figure 3:
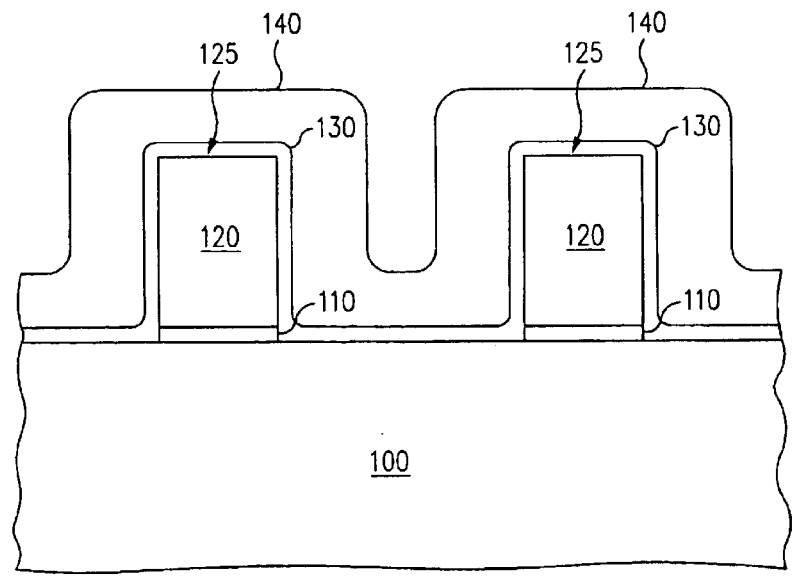
FIG. 3 is a cross-sectional view of a nitride layer disposed over the oxide layer of FIG. 2 before a nitride etch.

FIG. 2 illustrates the conformal deposition of a liner oxide layer 130. In one embodiment, oxide layer 130 may be deposited over gate structures 125 and substrate 100 by a thermal oxide process in which layer 130 is deposited as thinly as possible to allow for higher circuit densities. However, oxide layer 130 must also be of sufficient thickness to act as an etch stop to protect against removal of portions of gate structure 125 and semiconductor substrate 100 when etching subsequently-deposited nitride layer 140 (FIG. 3). In one embodiment, oxide layer 130 has a thickness greater than about 20 Å.

As shown in FIG. 3, a nitride layer 140 is conformally deposited over oxide layer 130 in accordance with an embodiment of the present invention. As a result of this conformal deposition, the layer is often thicker at the sides of gate structures 125 than on flat areas. Nitride layer 140 may be deposited by low pressure chemical vapor deposition ("LPCVD"), plasma enhanced chemical vapor deposition ("PECVD"), rapid thermal chemical vapor deposition ("RTCVD"), or other applicable techniques. In one embodiment, nitride layer 140 has a thickness less than about 1000 Å, and is preferably between about 230 Å and about 380 Å. However, the exact thickness of nitride layer 140 is determined by the size of the gate and requirements of the given geometry.

Nitride layer 140 is subsequently etched to form spacers adjacent to gate structures 125 and above oxide layer 130. Because of the ability of dry etch processes to etch anisotropically (in comparison to wet etch processes, which etch isotropically), dry etching is preferably used in spacer formation. There are three types of dry etch processes: those that have a physical basis (e.g., ion beam milling), those that have a chemical basis (e.g., non-plasma assisted chemical etching), and those that combine both physical and chemical mechanisms (e.g., reactive ion etching and some types of plasma-assisted etching). Primarily physical dry etch methods may not exhibit sufficient selectivity of the superjacent layer over the underlying layer causing punchthrough of the underlying layer. On the other hand, primarily chemical processes typically etch isotropically and therefore do not form vertical sidewalls. Consequently, chemically enhanced ion etching processes that combine the two mechanisms are preferred.

Accordingly, in one embodiment, the method of the present invention utilizes a dry etch involving simultaneous ion bombardment and polymerizing chemistry to etch nitride layer 140. The nitride etch is split into two steps, a main etch and an overetch, both of which involve a physical and chemical component of varying degree to allow for a nitride etch that is both anisotropic and selective. The degree of anisotropy and selectivity, as well as other factors such as the etch rate, are determined by a variety of parameters. These parameters include the quantity of power supplied to produce the plasma, the type and flow rate of etchant gas used to etch the nitride, and the pressure within the reaction chamber.

Table 1 below provides process parameter ranges in accordance with one embodiment of the present invention for etching nitride layer 140 to form substantially vertical profile spacers without leaving residue or violating the integrity of the underlying oxide layer. However, one having ordinary skill in the art will realize that the values will vary depending on the make and model of the etcher used in the process and the geometry of the gate structures involved.

TABLE 1

| Process Parameter | Main Etch Range | Overetch Range |
| --- | --- | --- |
| Ar Flow Rate (sccm) | 21–107 | 0 |
| Ar % (by volume) | 19–40 | 0 |
| $CF_4$ Flow Rate (sccm) | 80–200 | 150–160 |
| $CH_2F_2$ Flow Rate (sccm) | 9–22 | 5–10 |
| $CF_4/CH_2F_2$ Flow Ratio | 9:1–20:1 | 15:1–32:1 |
| F:C Ratio | 3.80–3.90 | 3.88–3.94 |
| Plasma Forming External Electrode RF Power (W) | 250–400 | 250–400 |
| Wafer Biasing Voltage (V) | (−50)–(−150) | (−50)–(−150) |
| Process Pressure (mTorr) | 10–20 | 50–120 |

In one specific embodiment, the etch of nitride layer 140 is performed in a commercially available 9400 DFM plasma reactor from Lam Research Corporation ("Lam") of Fremont, Calif., described in U.S. Pat. No. 6,218,309 and incorporated by reference herein.

The Lam plasma reactor includes a plasma processing chamber with a chamber wall, which is preferably made from anodized aluminum. To provide an electrical path to ground, the chamber wall is typically grounded. Above the chamber is disposed an inductive electrode powered by a first power source, such as a radio frequency (RF) power source.

Typically, a gas port is provided within the chamber and is arranged for releasing gaseous source materials, e.g., the etchant source gases, into the RF-induced plasma region. The gaseous source materials may be released from ports built into the walls of the chamber itself or through a shower head arranged in the dielectric window.

In one embodiment, a wafer such as that shown in FIG. 3 is introduced into the chamber and disposed on a chuck or pedestal, which acts as a bottom electrode and is preferably biased by a second power source. The chuck may be, in one example, an electrostatic chuck, which secures substrate 100 to the chuck's surface by electrostatic force.

By applying power to the top electrode which is external to the reactor, a plasma may be created within the chamber by causing the molecules of one or more of the inflowing gases to disassociate into respective submolecular constituents (e.g., free radicals or free ions). Power is applied to the electrostatic chuck or pedestal to attract ionized molecules in the plasma toward the wafer surface for sputter etching.

An exhaust port is typically disposed on one side of the chamber and coupled to a pump typically located outside of the chamber. The pump maintains the desired pressure inside the chamber.

Further, the reactor may be controlled by a programmable computer that is programmed to automate the processing of the wafer, including venting of the chamber, transfer of wafers to and from loading modules, and delivery of process gas and electrode power.

Although the Lam reactor has been employed and described above as the apparatus for etching nitride layer 140 and has shown particularly good results, other plasma reactors that are suitable for dry etching may be used.

In preparation for the main etch of nitride layer 140, a first gas flow is circulated through the reaction chamber. The first gas flow includes a first fluorocarbon component and optionally includes an inert gas component. The first fluorocarbon component aids in the selective and anisotropic etching of nitride over oxide. An attribute often used to characterize plasmas formed from such a feed gas is the ratio of fluorine atoms to carbon atoms ("F:C ratio") within the feed gas. The F:C ratio may also be used to describe a fluorocarbon molecule. The types and flow rates of etchant gases used in dry etch processes may be chosen to manipulate the F:C ratio of the gas flow and thereby control the plasma etch rate and selectivity to certain species.

In one embodiment of the present invention, the first fluorocarbon component includes $CF_4$ and $CH_2F_2$, the two gases flowing in a first ratio of $CF_4$ flow rate to $CH_2F_2$ flow rate. The flow rate of $CF_4$ in the first gas flow is between about 80 sccm and about 200 sccm and is preferably about 200 sccm. $CF_4$ comprises between about 69% and about 73% total concentration by volume of the first gas flow. The flow rate of $CH_2F_2$ in the first gas flow is between about 9 sccm and about 22 sccm and is preferably about 22 sccm. $CH_2F_2$ comprises between about 5% and about 8% total concentration by volume of the first gas flow. The first ratio of $CF_4$ flow rate to $CH_2F_2$ flow rate is between about 9:1 and about 20:1 and is preferably about 9:1. Accordingly, the first gas flow has an F:C ratio between about 3.80:1 and about 3.90:1.

In one embodiment, the inert gas component is argon. Argon helps to increase the uniformity of the plasma and etch process by acting as a diluent. Also, argon is ionized and aids in anisotropic etching because of its relatively large atomic weight. In one embodiment, the flow rate of argon may be between about 21 sccm and about 107 sccm and is preferably about 52 sccm. Argon comprises between about 19% and about 40% total concentration by volume of the first gas flow. Argon is preferred because of its weight and commercial availability, but other inert gases, such as neon, may also be used.

For the main etch, the process pressure within the reaction chamber is set at between about 10 mT and about 20 mT, and is preferably set at about 10 mT. As previously described for one embodiment, a vacuum means, such as a mechanical pump, is provided to exhaust gases from the reaction chamber and to thereby create the desired pressure within the chamber.

Figure 4:
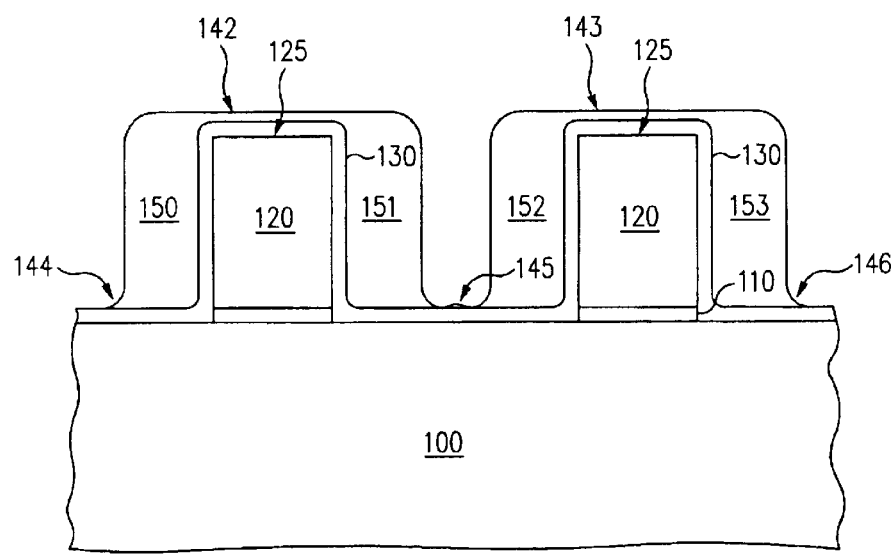
FIG. 4 is a cross-sectional view of nitride spacers formed after a main etch step leaving nitride residue, in accordance with an embodiment of the present invention.

The pressure and gas flow into the reaction chamber are maintained at the selected levels for a time sufficient to allow for stabilization of the gas flow rates and reaction chamber pressure. Once the environment within the reaction chamber is sufficiently stabilized, the electrodes of the reaction chamber are powered, a first plasma is formed within the reactor chamber, and a main etch step is performed to form nitride spacers 150–153, as shown in FIG. 4.

In the main etch, the external electrode power used by the plasma etcher to generate reactive species is set at between about 250 W and about 400 W and is preferably set at about 250 W. The bias voltage that biases the wafer to attract ionic species to strike the substrate surface is set at between about −50 V and about −150 V and is preferably set at about −50 V.

The bombardment of ions from the first plasma, in conjunction with the diffusion of chemically reactive species from the plasma to the topography of substrate 100 for polymer deposition and carbon accumulation allows nitride layer 140 to be etched in a highly directional manner but with selectivity to oxide.

The $CF_4$ component is used as an etchant source gas to form $CF_3^+$ and fluorine radicals that are responsible for ionic bombardment on the substrate. Argon radicals together with $CF_3^+$ radicals are both heavy on the scale of molecular weight and can maximize the bombardment energy delivered to the substrate surface for a highly anisotropic etch. Since ion bombardment is inversely related to the process pressure, ion bombardment increases as the process pressure is lowered due to decreased scattering disturbance in the course of ion trajectories. The converse is true when process pressure is increased. On the other hand, increasing the power applied to the plasma etcher for formation of the plasma increases the ion bombardment component of the etch due to increased formation of the plasma radicals that are involved in the ion bombardment. The converse is true when the power applied to the etcher is decreased.

Polymer formation plays an important role in slowing the dry etch rate and allowing for greater selectivity. $CH_2F_2$ produces a polymer deposition of the form $(CH_2)_n$ on the etched surface that acts to passivate the surface and thereby reduces the dry etch removal rate. Another source of polymer passivation is carbon accumulation on the surface from the dissociation of $CF_4$ into $CF_3^+$ upon low energy impacts.

The effects from the above described mechanisms, involving either the physical bombardment component or the chemical polymer deposition component, can be magnified or reduced to form nitride spacers with substantially vertical profiles, high uniformity, and high selectivity.

In one embodiment, the main etch step achieves relatively high etch rates of nitride between about 490 Å/min and about 540 Å/min with a nitride to oxide selectivity between about 1.26 and about 1.33.

The main etch step is preferably continued until nitride spacers 150–153 are formed adjacent to gate structures 125 with oxide layer 130 remaining intact between the nitride spacers and gate structures 125. The main etch step may be discontinued close to the etching of the full nitride layer using endpoint detection mechanisms such as optical emission spectroscopy and mass spectroscopy, which can provide signals for etch byproducts. In one example, the main etch step may be terminated when 4% of the full baseline spectrum of nitride etch byproducts is detected. Alternatively, the main etch step may be discontinued near the point of detection of oxide layer etching, determined to be the endpoint. In this case, the main etch step may be terminated by an endpoint detection preferably at 96% of endpoint as the trigger. The total time needed to etch nitride layer 140 during the main etch is dependent upon the thickness of nitride layer 140. In one embodiment, the main etch step may take between about 40 minutes and about 69 minutes. Upon completion of the main etch step, the supply of power to the electrodes of the reaction chamber is discontinued.

As shown in FIG. 4, because the main etch step is terminated prior to fully exposing oxide layer 130, a portion of nitride layer 140 will remain as residue near or along various vertical areas of the spacer sidewalls, as illustrated by residue 144–146. Residue layers 142 and 143 also remain over gate structures 125 after the main etch. If not cleared, portions of nitride similar to residue 145 may connect spacers 151 and 152 as nitride stringers, possibly causing device degradation or failure by impeding subsequent doping of the substrate. Nitride residue such as residue layers 142 and 143 may also connect spacers 150 and 151 and spacers 152 and 153, respectively, again possibly causing device degradation or failure by impeding contact to conductive gate 120. Further, nitride residue such as 144 and 146 cause spacers 150–153 to have sloping sidewall profiles near the base.

To clear this nitride residue and form vertical sidewall profiles while maintaining oxide layer integrity, an overetch step is performed. A second gas flow is circulated through the reaction chamber after termination of the first gas flow in preparation for the overetch step. In one embodiment, the second gas flow again includes a fluorocarbon component including $CF_4$ and $CH_2F_2$ but at a second ratio of $CF_4$ flow rate to $CH_2F_2$ flow rate.

In one embodiment, the flow rate of $CF_4$ in the second gas flow is between about 150 sccm and about 160 sccm and is preferably about 160 sccm. $CF_4$ comprises between about 94% and about 97% total concentration by volume of the second gas flow. The flow rate of $CH_2F_2$ in the second gas flow is between about 5 sccm and about 10 sccm and is preferably about 5 sccm. $CH_2F_2$ comprises between about 3% and about 6% total concentration by volume of the second gas flow.

The second ratio of $CF_4$ flow rate to $CH_2F_2$ flow rate is between about 15:1 and about 32:1 and is preferably about 32:1. Accordingly, the second gas flow has an F:C ratio between about 3.88:1 and about 3.94:1. A second process pressure within the reaction chamber is set at between about 50 mT and about 120 mT, and is preferably set at about 70 mT.

Figure 5:
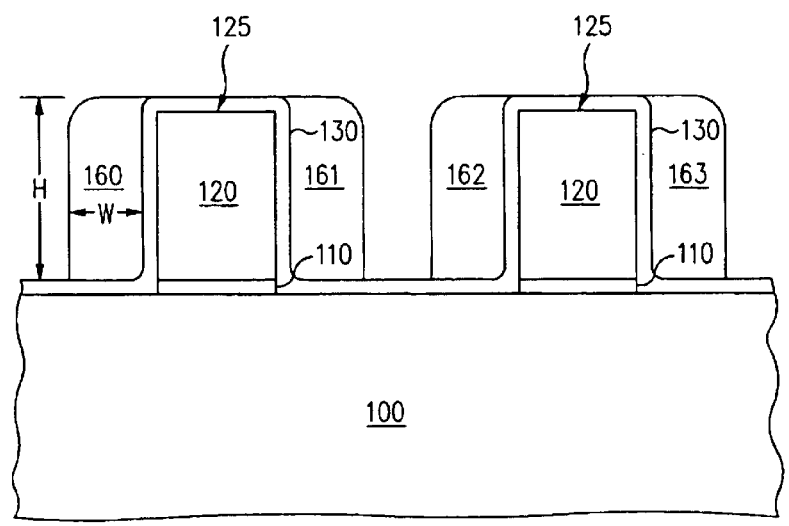
FIG. 5 is a cross-sectional view of nitride spacers formed after an overetch step without any nitride residue or oxide punchthrough, in accordance with an embodiment of the present invention.

The second process pressure and second gas flow into the reaction chamber are maintained at the selected levels for a time sufficient to allow for stabilization of the gas flow rates. Once the environment within the reaction chamber is sufficiently stabilized, the electrodes of the reaction chamber are again powered, a second plasma is formed within the reaction chamber, and an overetch step is performed to remove any residue of nitride layer 140 without punch-through of oxide layer 130. FIG. 5 illustrates nitride spacers 160–163 formed after the overetch step has removed nitride residue.

In the overetch, the external electrode power used by the plasma etcher to generate reactive species is set at between about 250 W and about 400 W and is preferably set at about 325 W. The bias voltage for biasing the wafer to attract ionic species to strike the substrate surface is set at between about −50 V and about −150 V and is preferably set at about −50 V.

The second ratio of $CF_4$ flow rate to $CH_2F_2$ flow rate and the F:C ratio of the second gas flow are relatively higher in the overetch step than the corresponding ratios in the main etch step. The process pressure and power applied to the chamber for plasma formation are also relatively higher during the overetch step compared to the main etch step. These increased ratios and increased process parameters correspond to increased selectivity for nitride over oxide at a slower etch rate.

The increased selectivity during the overetch is due in part to several different mechanisms as previously mentioned above. The elevated process pressure decreases incident velocities of the etching radicals upon the substrate topography. The second gas flow does not include an inert gas component, which lessens ion sputtering. Higher power for plasma formation sustains the formation of reactive species for carbon accumulation and polymer depositions on the etched surface, which lower the etch rate. Conversely, when the pressure and plasma power are both lowered, as is the case in the main etch step, ions begin striking the substrate more vigorously but at a lower concentration level of reactive species, thereby allowing for lower selectivity but higher anisotropic etching for creating vertical sidewalls.

Overetch processing achieves nitride etch rates between about 170 Å/min and about 190 Å/min with a nitride to oxide selectivity between about 3.1 and about 3.7. A selectivity of this magnitude gives margin for removal of the nitride residue while minimizing the loss of underlying exposed oxide. Thus, as shown in FIG. 5, the overetch step removes residue layers 142 and 143 from above gate structure 125 and residue 145 between spacers 151 and 152 that could cause a nitride stringer effect. Residue 144 and 146 are also etched to form vertical sidewall profiles at the base of the nitride spacers. A portion of oxide layer 130 is removed during the overetch step but the integrity of oxide layer 130 may be maintained because of the higher selectivity of the overetch, even at thin oxide levels. In one embodiment, oxide layer 130 may have a thickness as low as 20 Å.

Various methods may be used to determine when the overetch step should be stopped. In one example, specifications for the oxide layer thickness may be used in conjunction with the overetch rate and nitride layer thickness to determine a time frame for stopping the overetch. In one embodiment, the overetch step may constitute between about 15% and about 49% by film thickness of the nitride layer.

FIG. 5 illustrates the formation of nitride spacers 160–163 after the overetch has been completed. In one embodiment, nitride spacers 160–163 have a width W between about 230 Å and about 380 Å, and a height H between about 4100 Å and about 5200 Å.

One measure of spacer thickness uniformity is the standard deviation of the thicknesses of a number of spacers. Standard deviation is a measure of the dispersion of a set of data from their mean, and may be calculated by taking the square root of the variance. By looking at the standard deviation of the thicknesses of a set of spacers formed by a particular etch process, the ability of that process to form uniformly thick spacers may be determined. With feature size decreasing to compensate for increasing circuit densities, the thickness of spacers is being decreased as well. Because reduced feature sizes exacerbate the effect of a specific amount of deviation from average, the variability in spacer thickness uniformity that may result from conventional dry etch processes becomes an even greater problem when ultra thin spacers must be formed. Unfortunately, many conventional etch processes are only capable of forming nitride spacers whose thicknesses have standard deviation of 10% or more. However, in accordance with one embodiment of the present invention, a standard deviation of less than 2.5% (1σ) can be achieved.

Optionally, after the formation of spacers 160–163, a heavy source drain region may be formed by implanting a second dopant utilizing the nitride spacers as a mask to form source/drain regions outside the LDD area.

Figure 6:
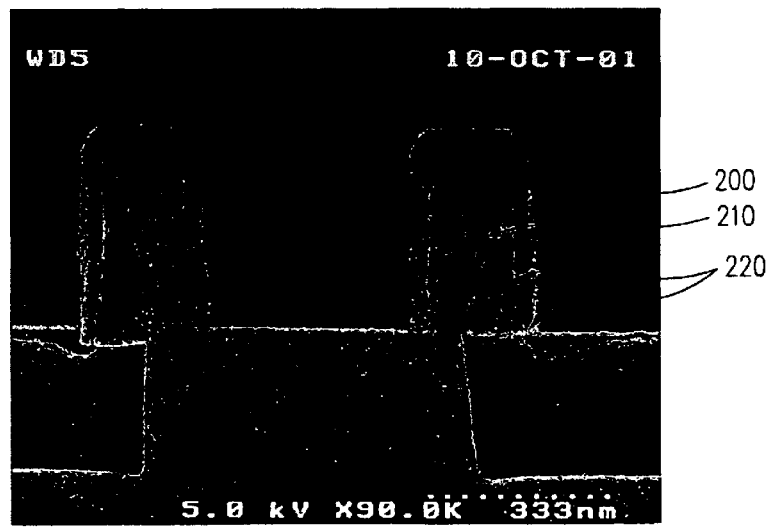
FIG. 6 is a scanning electron microscope (SEM) picture of silicon nitride spacers formed adjacent to two gate structures using a method in accordance with one embodiment of the present invention.

FIG. 6 is a scanning electron microscope (SEM) picture of silicon nitride spacers 200 formed adjacent to two gate structures 210 over a thin oxide layer 220 using a method in accordance with one embodiment of the present invention.

The above-described embodiments of the present invention are merely meant to be illustrative and not limiting. Various changes and modifications may be made without departing from this invention in its broader aspects. For example, the nitride spacer manufacturing method of the present invention is suitable for floating gate memory structures such as described in U.S. Pat. No. 6,355,524, issued on Mar. 12, 2002. However, the invention is not limited to LDD structures or any other structures that may involve hot carrier prevention features. For example, in some floating gate memory embodiments, the hot carrier effect is desirable to change the state of the memory. Accordingly, the invention is not limited to particular structures, dimensions, or process parameters. Therefore, the appended claims encompass all such changes and modifications as falling within the true spirit and scope of this invention.

We claim:

1. A manufacturing method, comprising:
   providing a gate structure over a substrate;
   providing a silicon oxide layer over said gate structure and said substrate;
   providing a silicon nitride layer over said silicon oxide layer;
   providing a first gas flow having a first ratio of fluorine atoms to carbon atoms;
   applying a first quantity of power to said first gas flow to form a first plasma and etching a first portion of said silicon nitride layer with said first plasma;
   providing a second gas flow having a second ratio of fluorine atoms to carbon atoms greater than said first ratio of fluorine atoms to carbon atoms of said first gas flow; and
   applying a second quantity of power to said second gas flow to form a second plasma and etching a second portion of said silicon nitride with said second plasma, wherein the etching operations result in formation of silicon nitride spacers.

2. The method of claim 1, wherein said gate structure has a width between about 0.14 μm and about 0.18 μm.

3. The method of claim 1, wherein said silicon oxide layer has a thickness at least about 20 Å.

4. The method of claim 1, wherein said first gas flow includes $CF_4$ and $CH_2F_2$ at a flowrate ratio of $CF_4$ to $CH_2F_2$ between about 9:1 and about 15:1.

5. The method of claim 1, wherein said first quantity of power is between about 250 W and about 400 W.

6. The method of claim 1, wherein said etching with said first plasma takes place at a first process pressure between about 10 mTorr and about 20 mTorr.

7. The method of claim 6, wherein said etching with said second plasma takes place at a second process pressure higher than said first process pressure, said second process pressure being between about 50 mTorr and about 120 mTorr.

8. The method of claim 1, wherein said second gas flow includes $CF_4$ and $CH_2F_2$ at a higher flowrate ratio of $CF_4$ to $CH_2F_2$ than said first gas flow.

9. The method of claim 8, wherein said higher flowrate ratio of $CF_4$ to $CH_2F_2$ is between greater than about 15:1 and about 32:1.

10. The method of claim 1, wherein said second quantity of power is greater than said first quantity of power, said second quantity of power being between about 250 W and about 400 W.

11. A manufacturing method, comprising:

providing a gate structure over a substrate;

providing a silicon oxide layer over said gate structure and said substrate;

providing a silicon nitride layer over said silicon oxide layer;

applying a main etch, comprising:
- providing a first gas flow including a first ratio of $CF_4$ flow rate to $CH_2F_2$ flow rate; and
- applying a first quantity of power to said first gas flow to create a first plasma and etching a first portion of said silicon nitride layer with said first plasma at a first process pressure; and applying an overetch, comprising:
- providing a second gas flow including a second ratio of $CF_4$ flow rate to $CH_2F_2$ flow rate greater than said first ratio of $CF_4$ flow rate to $CH_2F_2$ flow rate;
- applying a second quantity of power to said second gas flow to create a second plasma, said second quantity of power being greater than said first quantity of power, and etching a second portion of said silicon nitride layer with said second plasma at a second process pressure greater than said first process pressure, wherein the etching operations result in formation of silicon nitride spacers.

* * * * *

UNITED STATES PATENT AND TRADEMARK OFFICE
CERTIFICATE OF CORRECTION

PATENT NO. : 6,846,730 B2
DATED : January 25, 2005
INVENTOR(S) : Barbara A. Haselden and John Lee It is certified that error appears in the above-identified patent and that said Letters Patent is hereby corrected as shown below:

Column 10,
Line 47, delete "15:1" and insert -- 20:1 --.

Signed and Sealed this

Eighteenth Day of October, 2005

JON W. DUDAS
*Director of the United States Patent and Trademark Office*